United States Patent [19]

Makihara et al.

[11] Patent Number: 5,600,171

[45] Date of Patent: Feb. 4, 1997

[54] MASK ROM DEVICE

[75] Inventors: Hiroyasu Makihara; Akira Okugaki; Kenji Kohda; Masahide Kaneko, all of Hyogo, Japan

[73] Assignee: Mitsubishi Denki Kabushiki Kaisha, Tokyo, Japan

[21] Appl. No.: 274,603

[22] Filed: Jul. 13, 1994

[30] Foreign Application Priority Data

Jul. 15, 1993 [JP] Japan ..................................... 5-175360

[51] Int. Cl.[6] ........................... H01L 29/76; H01L 21/265
[52] U.S. Cl. .......................... 257/390; 257/391; 257/392; 437/48; 437/52
[58] Field of Search .................................. 257/390, 391, 257/392; 437/48, 52

[56] References Cited

U.S. PATENT DOCUMENTS 5,323,048  6/1994  Onuma ..................................... 257/390

*Primary Examiner*—Mark V. Prenty
*Attorney, Agent, or Firm*—Lowe, Price, LeBlanc & Becker

[57] ABSTRACT

A mask ROM device includes a plurality of memory cells each having an enhancement type FET having a gate electrode and first and second source/drain regions, a plurality of word lines connected to the gate electrodes, a plurality of bit lines connected to the first source/drain regions, a connection line formed above the gate electrode so as to electrically connect the first and second source/drain regions through contact holes in each of memory cells selected according to information to be stored.

5 Claims, 10 Drawing Sheets

MASK ROM DEVICE

BACKGROUND OF THE INVENTION

1. Field of the Invention

The present invention relates to non-volatile semiconductor memory devices, and more particularly, to an improvement of a mask ROM (Read Only Memory) device and a method of manufacturing thereof.

2. Description of the Background Art

In a mask ROM device, user's data is written in its memory device using a mask in the manufacturing process. In writing of data in the mask ROM device, either a depletion type FET (Field-Effect Transistor) or an enhancement type FET is generally formed depending on data to be written. Selection between a depletion type FET and an enhancement type FET is generally carried out by changing a threshold voltage Vth of an FET by ion implantation.

In the depletion type FET, drain current flows even if the gate voltage is 0 V. On the other hand, in the enhancement type FET, drain current does not flow if the gate voltage is 0 V. Therefore, it is possible to write user's data in a mask ROM device by forming a depletion type FET and an enhancement type FET when data to be written is "0" and "1", respectively.

FIG. 9 shows an equivalent circuit diagram of an NAND type memory device as one example of a conventional mask ROM device. The mask ROM device includes bit lines 901 to 903, word lines 911 to 913, enhancement type transistors QE1 to QE5, and depletion type transistors QD1 to QD4. In order to read out information of "0" or "1" stored in a selected memory cell, a voltage of, for example, 0 V which brings the enhancement type FET to an off state is supplied only to a word line connected to the selected memory cell, and a voltage VG which brings the enhancement type FET to an on state is supplied to the remaining two word lines.

When information stored in transistor QE3 connected to bit line 902 is read out, for example, word line 911 is selected, to which 0V is applied. At this time, since transistor QE3 is an enhancement type FET, transistor QE3 is not brought to an on state. On the other hand, since the voltage VG is applied to non-selected word lines 912 and 913, transistors QD2 and QD3 are in an on state. As a result, since transistor QE3 is in an off state, current does not flow in a series circuit including transistors QE3, QD2 and QD3. Information "1" stored in transistor QE3 is read out through bit line 902.

Similarly, when information stored in transistor QD3 connected to bit line 902 is read out, word line 913 is selected, to which 0 V is applied. At this time, since transistor QD3 is a depletion type FET, transistor QD3 is in an on state even if the voltage applied to word line 913 is 0 V. On the other hand, since the voltage VG is applied to non-selected word lines 911 and 912, both transistors QE3 and QD2 are in an on state. As a result, current flows in a series circuit including transistors QE3, QD2 and QD3, and information "0" stored in transistor DQ3 is read out through bit line 902.

FIG. 10 is a plan view showing one example in which the mask ROM device shown in the equivalent circuit diagram of FIG. 9 is implemented on a silicon substrate. Corresponding to the equivalent circuit diagram of FIG. 9, a mask ROM device of FIG. 10 includes bit lines 901 to 903 and word lines 911 to 913. A square region 1020 shown by a dashed line indicates a region where ions are implanted for a depletion type FET.

FIG. 11 is a sectional view taken along the line 11—11 in FIG. 10. In this sectional view, $N^+$doped regions 1102 serving as source/drain regions are formed in a surface layer of a P type silicon substrate 1103. Impurity region 1020 for a depletion type FET is formed including a channel region between the source/drain regions. Word lines 911 to 913 are formed on the channel regions with a thin gate insulation film interposed therebetween. Source/drain regions 1102 and word lines 911 to 913 are covered with an insulating layer 1101. It should be noted that impurity regions 1020 for a depletion type FET are generally formed with an ion implantation method using a resist mask or the like before word lines 911 to 913 are formed.

More specifically, in the conventional mask ROM device as described above, data to be stored must be written by forming impurity region 1020 for a depletion type FET at a relatively initial stage of the manufacturing process before formation of a gate electrode. Therefore, a period from reception of data to be stored from the user to delivery of a mask ROM device having the data written therein (hereinafter referred to as a "turnaround time") is long.

SUMMARY OF THE INVENTION

In view of the problem of the conventional device as described above, one object of the present invention is to provide a mask ROM device which can shorten a turnaround time and a method of manufacturing thereof.

A mask ROM device according to one aspect of the present invention includes a plurality of memory cells each including an enhancement type FET having a gate electrode and first and second source/drain regions, a plurality of word lines connected to the gate electrodes, a plurality of bit lines connected to the first source/drain regions, and a connection line formed above the gate electrode so as to electrically connect the first and second source/drain regions through contact holes in each memory cell selected according to information to be stored.

The connection line can write data by forming a short-circuit between the first and second source/drain regions of a selected transistor. Furthermore, the connection line is formed after formation of the gate electrode. Therefore, the turnaround time can be shortened.

According to another aspect of the present invention, a method of manufacturing a mask ROM device including a plurality of enhancement type FETs each having a gate electrode and a pair of source/drain regions includes the steps of forming the gate electrodes, forming the source/drain regions, forming an insulating layer so as to cover the gate electrodes and the source/drain regions, and forming a conductor line on an insulating layer so as to form a short-circuit through contact holes between the pair of source/drain regions in each selected FET.

More specifically, since data from the user can be written by selectively forming a conductor line after forming the gate electrode, it is possible to shorten the turnaround time of the mask ROM device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
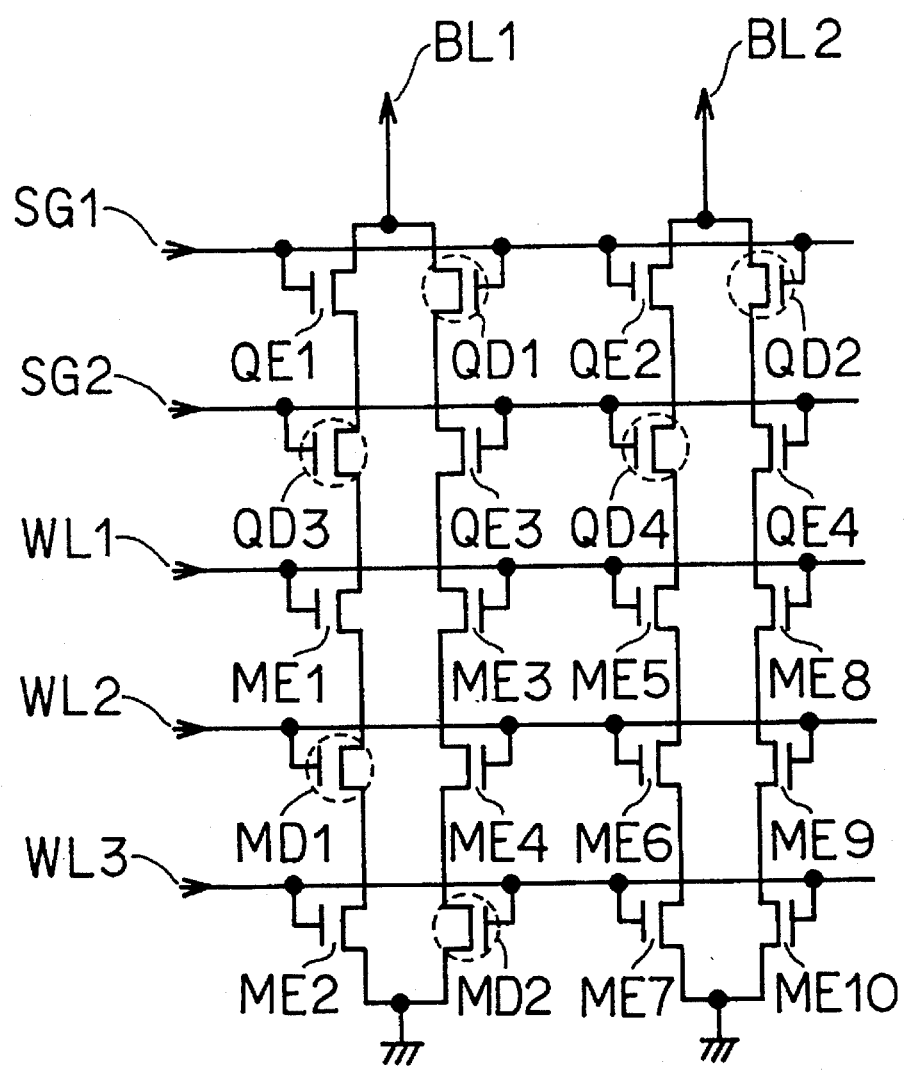
FIG. 1 is an equivalent circuit diagram showing a mask ROM device according to one embodiment of the present invention.
Figure 2:
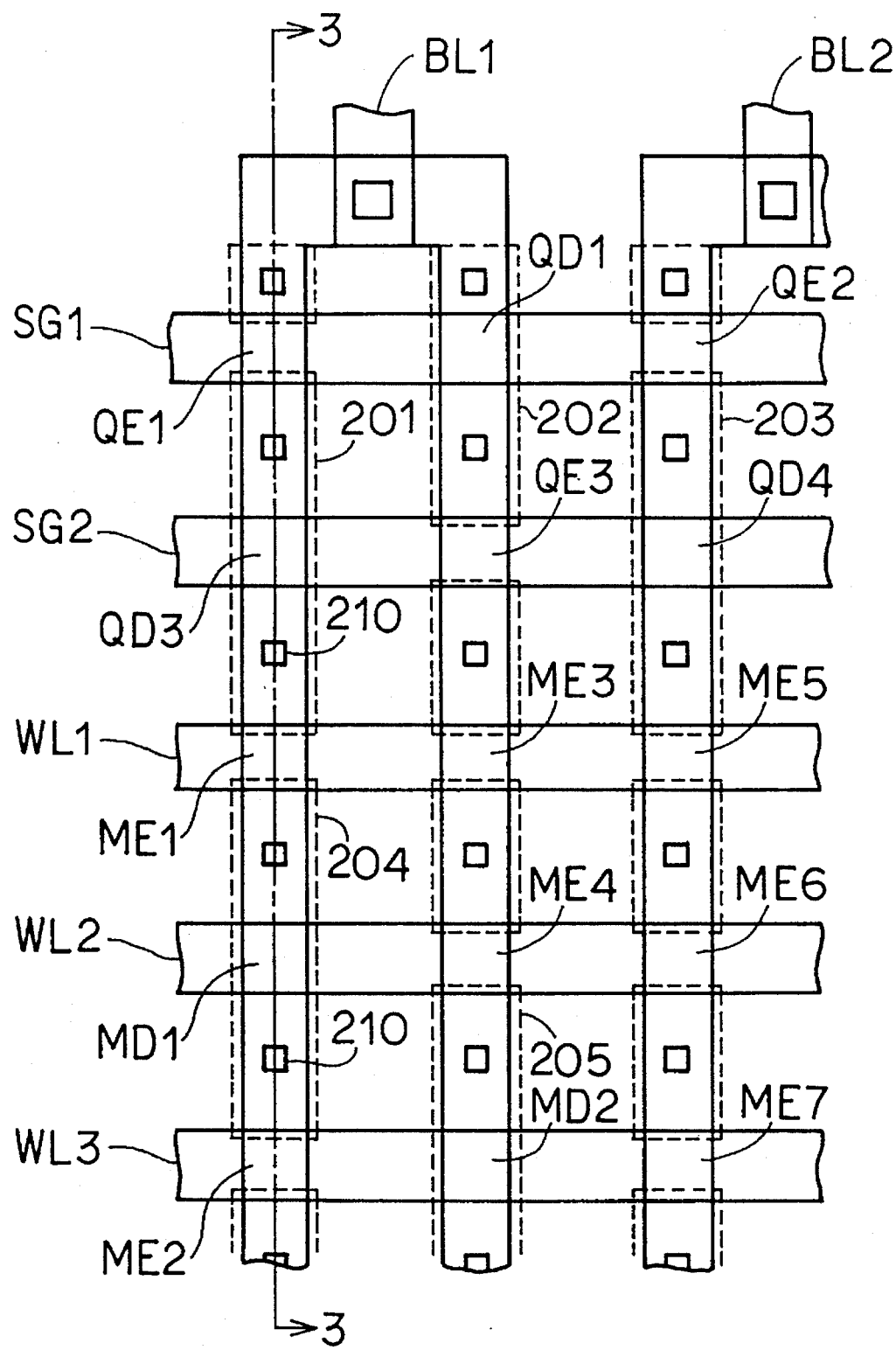
FIG. 2 is a plan view showing one example of the mask ROM device formed on a semiconductor substrate according to the equivalent circuit diagram of FIG. 1.
Figure 3:
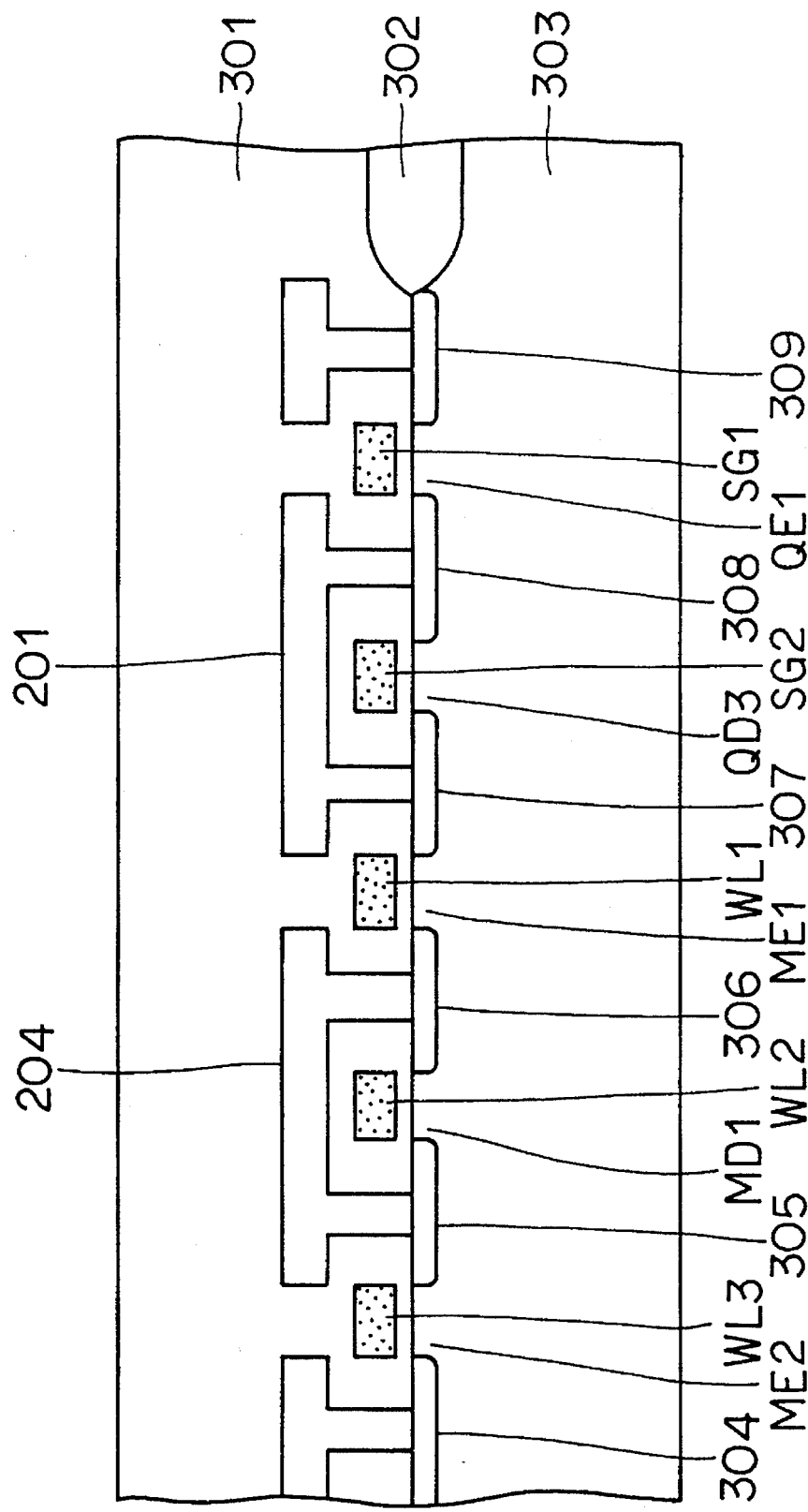
FIG. 3 is a sectional view taken along the line 3—3 in FIG. 2.

Referring to FIGS. 1 to 3, description will be given of a mask ROM device according to one embodiment of the present invention.

Referring to FIG. 1, one example of an equivalent circuit diagram of an NAND type mask ROM device is shown. The mask ROM device includes bit lines BL1 and BL2, select lines SG1 and SG2, word lines WL1 to WL3, enhancement type memory transistors ME1 to ME10, depletion type memory transistors MD1 and MD2, enhancement type transistors QE1 to QE4 having their gates connected to select line SG1 or SG2, and depletion type transistors QD1 to QD4 having their gates connected to select line SG1 or SG2.

In order to read out information stored in memory transistor MD1, for example, in the mask ROM device shown in FIG. 1, word line WL2 and select line SG2 are rendered 0 V, and the voltage VG which brings an enhancement type FET to an on state is applied to word lines WL1 and WL3 and select line SG1. At this time, since memory transistor MD1 is a depletion type FET, bit line BL1 is grounded through transistors QE1, QD3, ME1, MD1 and ME2, and information "0" written in memory transistor MD1 is read out through bit line BL1.

FIG. 2 is a plan view showing one example of the mask ROM device implemented according to the equivalent circuit diagram of FIG. 1. In the mask ROM device, all the transistors are formed actually as enhancement type FETs. However, short-circuiting lines 201 to 205 are formed above the word lines so that some transistors selected from these transistors operate as if they were depletion type FETs.

Short-circuiting line 201, for example, forms a short-circuit through contact holes 210 between a pair of source/drain regions of transistor QD3. Therefore, although transistor QD3 is formed actually as an enhancement type FET, transistor QD3 operates as if it were a depletion type FET, because the source/drain regions are rendered conductive even if 0 V is applied to the gate electrode. Short-circuiting lines 201 to 205 can be formed using polycrystalline silicon, metals, alloys or metal silicides.

FIG. 3 shows a sectional structure taken along the line 3—3 in FIG. 2. In this sectional structure, a field oxide film 302 is formed on the surface of a P type semiconductor substrate 303. N$^+$type source/drain regions 304 to 309 are formed in the surface layer of P type semiconductor substrate 303. Word lines to WL1 to WL3 and select lines SG1 and SG2 are formed on channel regions between the source/drain regions. Short-circuiting lines 201 and 204 are formed above select line SG2 and word line WL2, respectively. The upper side surface of the mask ROM device is covered with an insulating layer 301.

Figure 11:
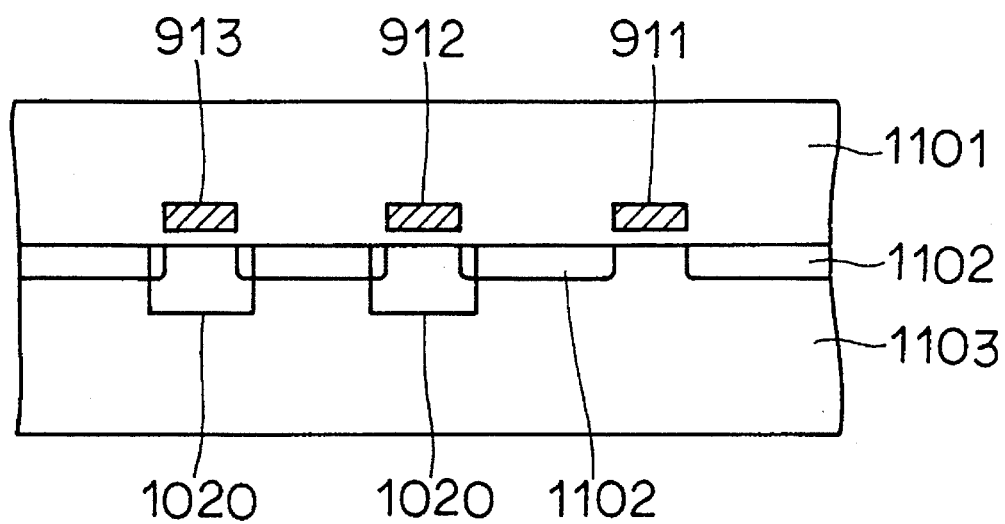
FIG. 11 is a sectional view taken along the line 11—11 in FIG. 10.

In such a mask ROM device, short-circuiting line 204, for example, forms a short-circuit between source/drain regions of transistor MD1, so that transistor MD1 operates as if it were a depletion type transistor. More specifically, in such a mask ROM device as shown in FIG. 3, it is not necessary to form an impurity region for a depletion type FET before formation of a gate electrode, unlike the conventional mask ROM device shown in FIG. 11. User's data can be written by forming a short-circuiting line after formation of a gate electrode. Therefore, such a mask ROM device as shown in FIG. 3 can shorten the turnaround time.

Figure 4:
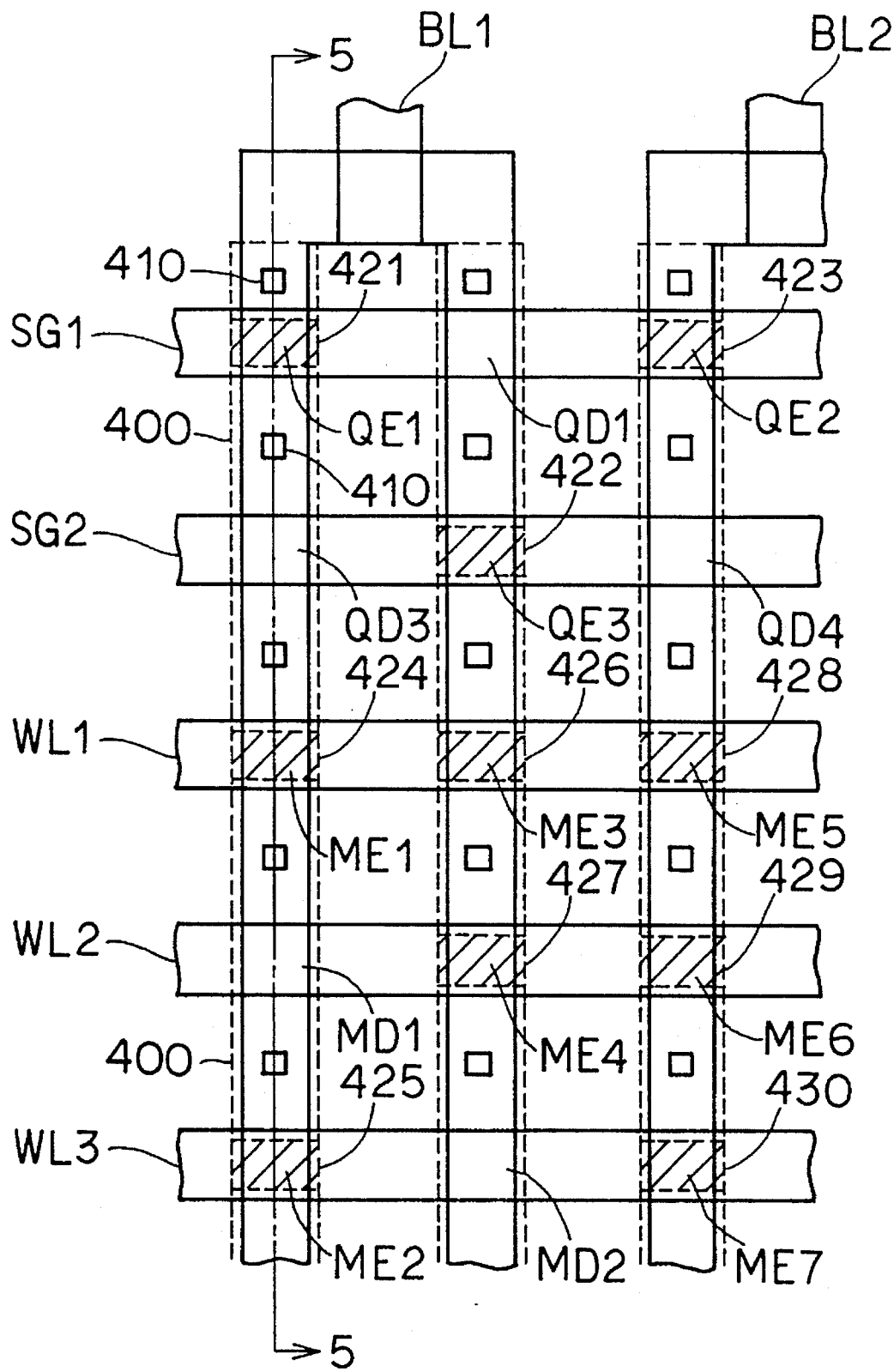
FIG. 4 is a plan view showing another example of the mask ROM device formed on the semiconductor substrate according to the equivalent circuit diagram of FIG. 1.

FIG. 4 is a plan view showing another example of the mask ROM device implemented according to the equivalent circuit diagram of FIG. 1. Also in this mask ROM device, all the transistors are formed actually as enhancement type FETs. However, in each of some selected transistors, connection is made between source/drain regions through contact holes 410 by a short-circuiting line 400. Short-circuiting line 400 is formed of a semiconductor of one conductivity type, including a plurality of isolation regions 421 to 430 of the opposite conductivity type. More specifically, in transistor QD3, for example, since the source/drain regions are connected by short-circuiting means of one conductivity type, transistor QD3 operates as if it were a depletion type FET even when 0 V is applied to the gate electrode. On the other hand, in transistor ME1, short-circuiting line 400 of one conductivity type is electrically disconnected between the source/drain regions by isolation region 424 of the opposite conductivity type. Therefore, a short-circuit does not exist between the source/drain regions of transistor ME1, and transistor ME1 operates as an inherent enhancement type FET. Short-circuiting line 400 can be formed of, for example, N type polycrystalline silicon, and isolation regions 421 to 430 can be formed of P type polycrystalline silicon.

Figure 5:
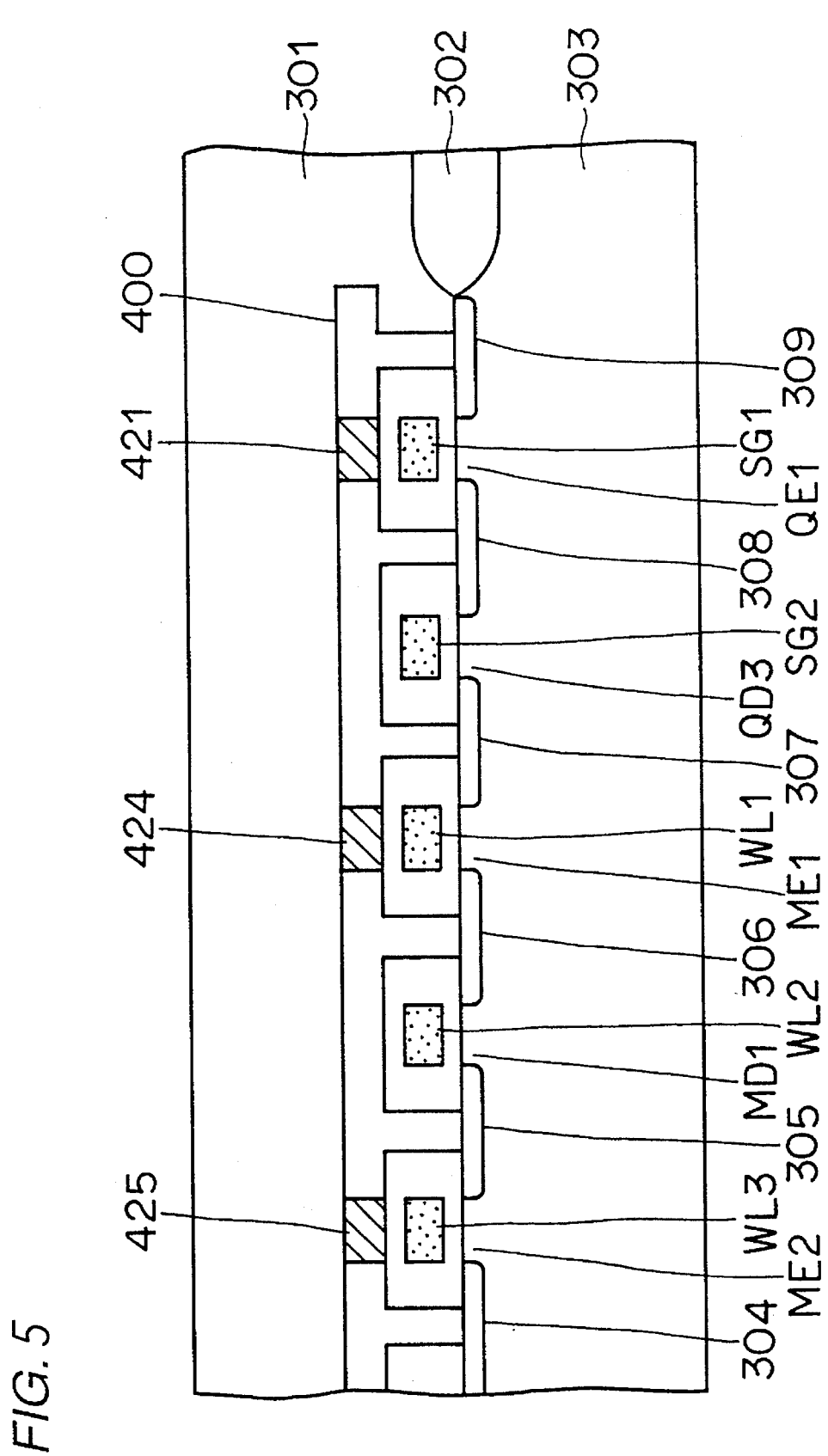
FIG. 5 is a sectional view taken along the line 5—5 in FIG. 4.

FIG. 5 shows a sectional structure taken along the line 5—5 in FIG. 4. Although the mask ROM device of FIG. 5 is similar to that of FIG. 3, short-circuiting line 400 is formed of a semiconductor of one conductivity type, and isolation regions 421,424 and 425 are formed of a semiconductor of the opposite conductivity type in the mask ROM device of FIG. 5. More specifically, it is not necessary to form impurity region 1020 for a depletion type FET shown in FIG. 11 before formation of a gate electrode also in such a mask ROM device as shown in FIG. 5. It is possible to form short-circuiting line 400 and isolation regions 421,424 and 425 after formation of a gate electrode. Therefore, user's data can be written when short-circuiting line 400 and isolation regions 421, 424 and 425 are formed after formation of a gate electrode, thereby shortening the turnaround time.

FIGS. 6A–6D and 7A–7D illustrate the manufacturing process of such a mask ROM device as shown in FIG. 3.

Figure 6A:
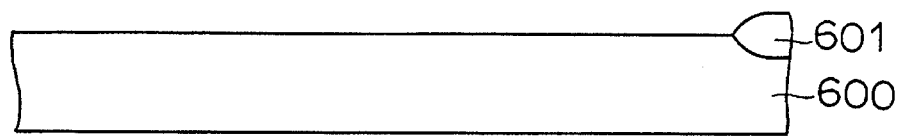
FIGS. 6A–6D are sectional views illustrating the manufacturing process of the mask ROM device shown in FIG. 3.

In FIG. 6A, a field oxide film 601 is formed on a semiconductor substrate 600.

Figure 6B:
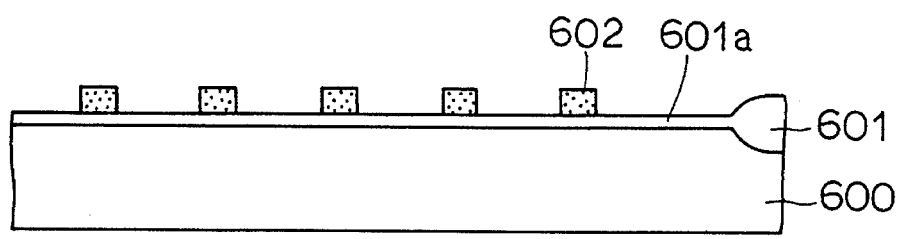

In FIG. 6B, a gate electrode 602 is formed after formation of a gate oxide film 601a.

Figure 6C:
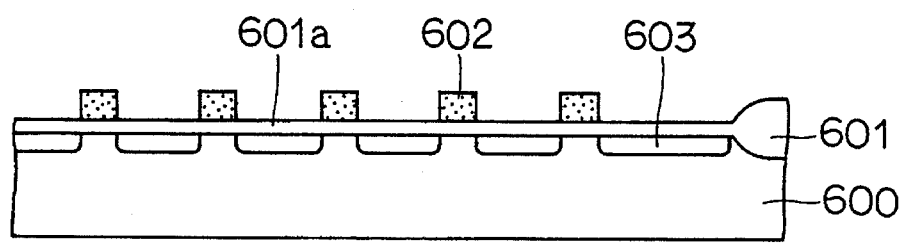

In FIG. 6C, source/drain regions 603 of an FET are formed with an ion implantation method.

Figure 6D:
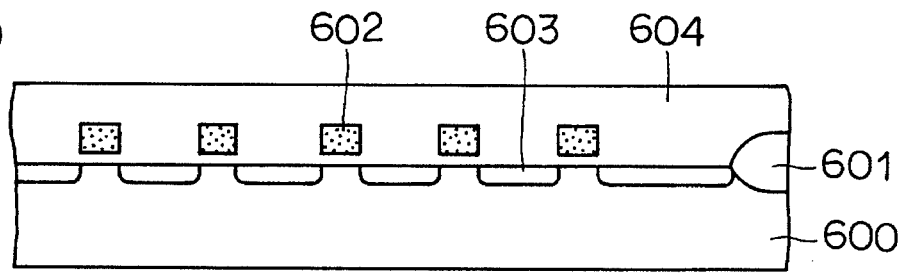

In FIG. 6D, gate electrodes 602 are covered with an interlayer insulating film 604.

Figure 7A:
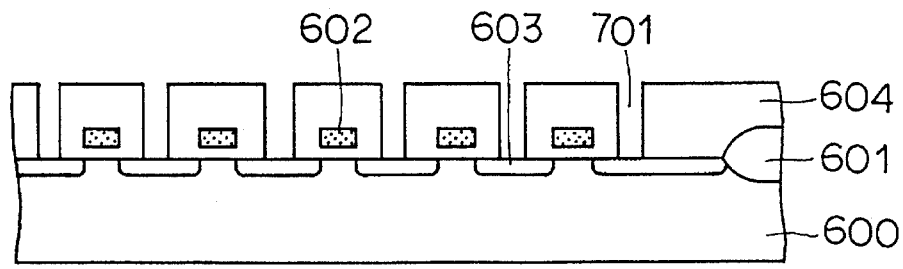
FIGS. 7A–7D are sectional views illustrating the manufacturing process following to that of FIGS. 6A–6D.

In FIG. 7A, contact holes 701 are provided in interlayer insulating film 604.

Figure 7B:
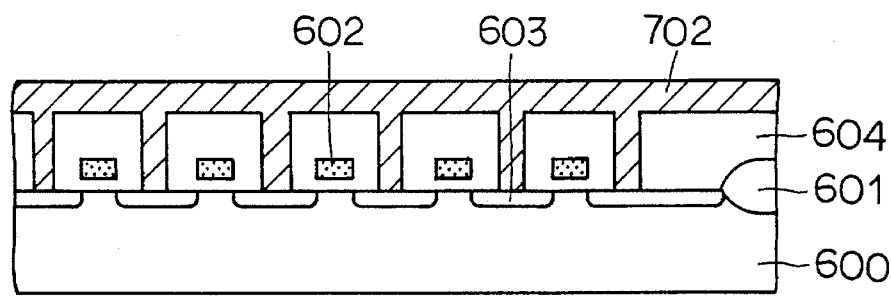

In FIG. 7B, source/drain regions 603 are electrically connected to each other through the contact holes by a conductor layer 702 formed of polycrystalline silicon, Al or metal silicide.

Figure 7C:
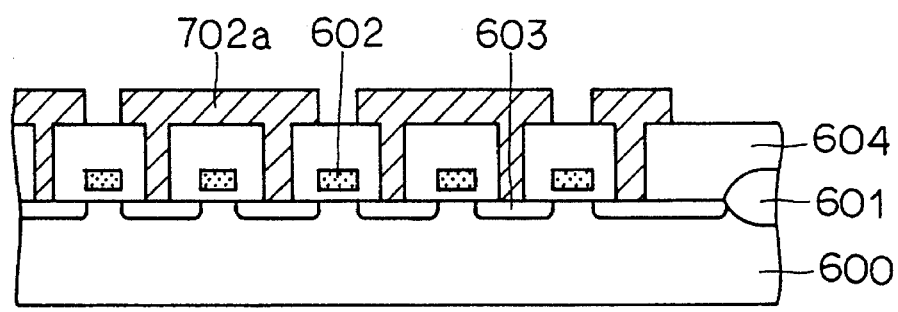

In FIG. 7C, conductor layer 702 is patterned by etching with a resist mask to selectively form a short-circuiting line 702a. More specifically, only in an FET selected based on user's data, source/drain regions are connected by short-circuiting line 702a. User's data is to be written in the mask ROM device at this time.

Figure 7D:
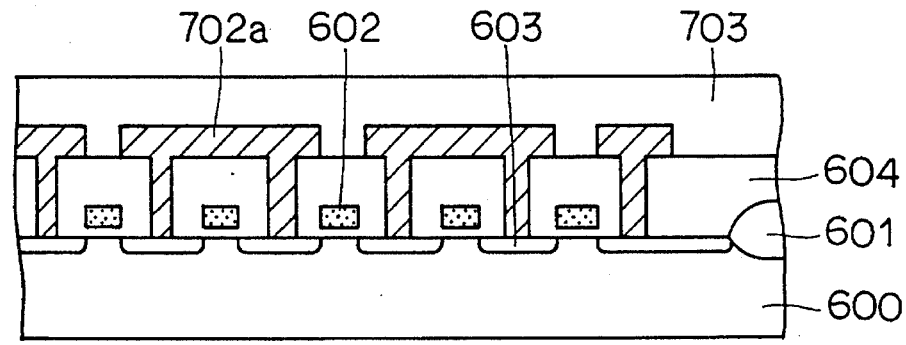

In FIG. 7D, short-circuiting line 702a is then covered with an insulating layer 703, thereby completing the mask ROM device.

As is clear from FIGS. 6A–6D and 7A–7D, since user's data is written at a later stage of the manufacturing process in such a mask ROM device as shown in FIG. 7D, it will be understood that the turnaround time can be shortened.

Figure 8A:
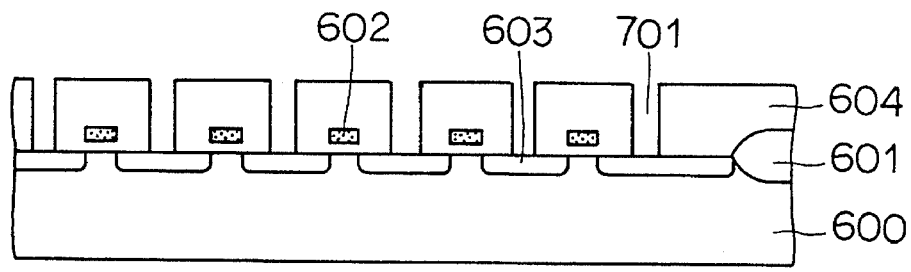
FIGS. 8A–8D are sectional views illustrating the manufacturing process of the mask ROM device shown in FIG. 5.

FIGS. 8A–8D illustrate the manufacturing process of such a mask ROM device as shown in FIG. 5. The manufacturing step shown in FIG. 8A corresponds to that shown in FIG. 7A. The manufacturing steps up to FIG. 8A are similar to those shown in FIGS. 6A–6D.

Figure 8B:
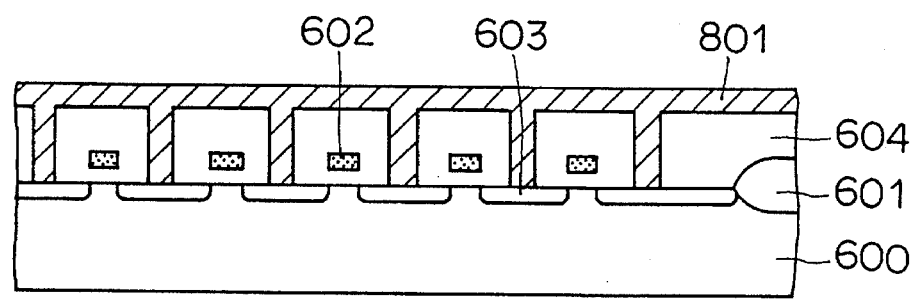

In FIG. 8B, source/drain regions of an FET are connected to each other through contact holes by a patterned semiconductor line 801 of one conductivity type.

Figure 8C:
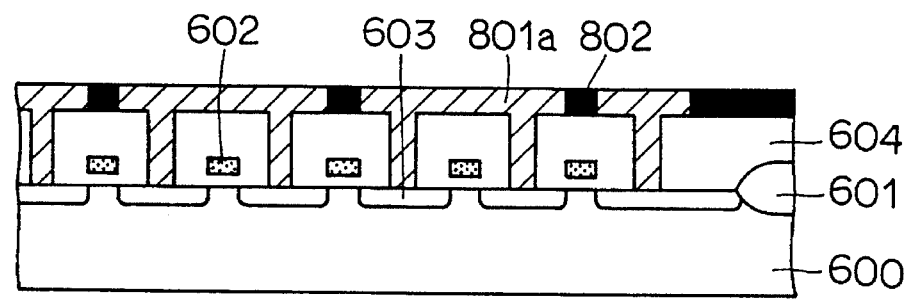

In FIG. 8C, in semiconductor line 801 of one conductivity type, formed are a plurality of isolation regions 802 of the opposite conductivity type based on user's data. More specifically, semiconductor line 801 of one conductivity type is divided into a plurality of short-circuiting lines 801a by the plurality of isolation regions 802. The plurality of isolation regions 802 can be formed by, for example, implanting impurity ions of the opposite conductivity type into semiconductor line 801 of one conductivity type using a resist mask pattern. More specifically, user's data is to be written in the mask ROM device at the time of ion implantation using a mask pattern.

Figure 8D:
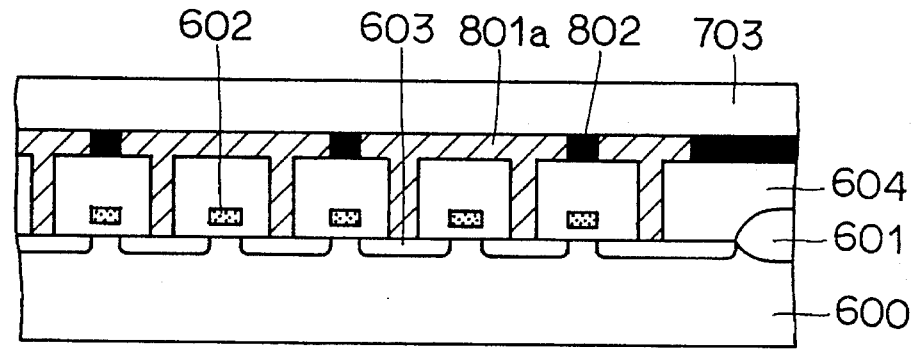
Figure 9:
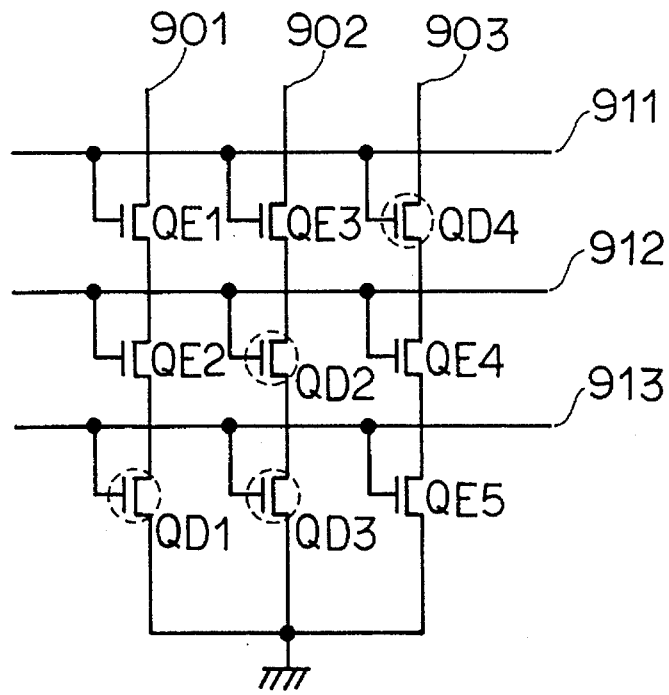
FIG. 9 is an equivalent circuit diagram showing one example of a conventional mask ROM device.
Figure 10:
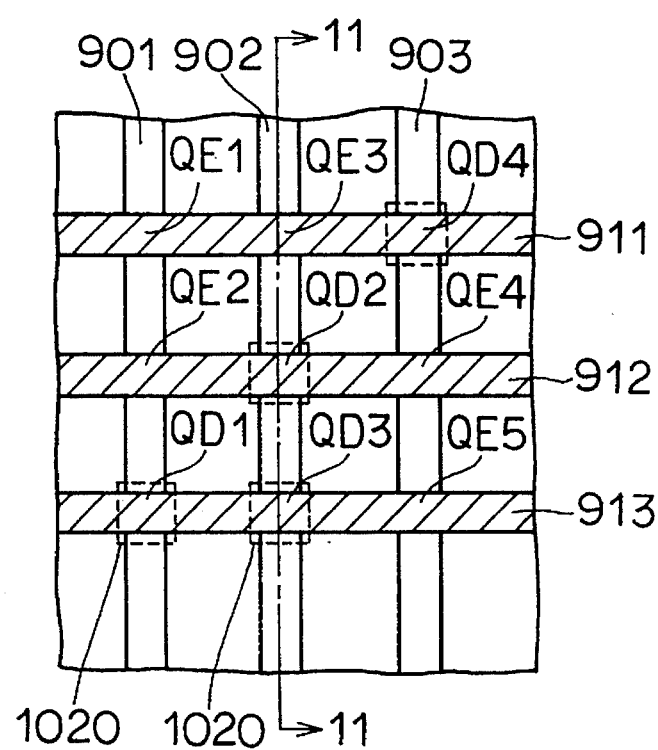
FIG. 10 is a plan view showing one example of the mask ROM device implemented according to the equivalent circuit diagram of FIG. 9.

In FIG. 8D, short-circuiting lines 801a of one conductivity type and isolation regions 802 of the opposite conductivity type are covered with insulating layer 703, thereby completing the mask ROM device.

As is seen from FIGS. 6A–6D and 8A–8D, since user's data can be written at a later stage of the manufacturing process in such a mask ROM device as shown in FIG. 8D, it will be understood that the turnaround time can be shortened.

As described above, in the mask ROM device of the present invention, all the memory transistors are formed as enhancement type FETs. By forming short-circuiting lines between source/drain regions of transistors selected based on user's data at a later stage of the manufacturing process, the selected transistors operate as if they were depletion type FETs. Therefore, user's data can be written at a later stage of the manufacturing process in the mask ROM device of the present invention, thereby shortening the turnaround time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mask ROM device, comprising:

a plurality of memory cells, each said memory cell including an enhancement type FET having a gate electrode and first and second source/drain regions;

a plurality of word lines connected to said gate electrodes;

a plurality of bit lines connected to said first source/drain regions; and a conductive semiconductor line formed above said gate electrode so as to connect said first and second source/drain regions through contact holes in each of said memory cells, wherein said conductive semiconductor line is formed of one conductivity type in each of memory cells selected according to information to be stored, and said conductive semiconductor line includes a segment of the opposite conductivity type sandwiched by segments of said one conductivity type so as to avoid formation of a short-circuit between said first and second source/drain regions in each of non-selected memory cells.

2. The mask ROM device as recited in claim 1, wherein said conductive semiconductor line is formed of polycrystalline silicon.

3. The mask ROM device as recited in claim 2, wherein said conductive semiconductor line is formed of N type polycrystalline silicon, and said segment of the opposite conductivity type is formed of P type polycrystalline silicon.

4. A method of manufacturing a mask ROM device including a plurality of enhancement type FETs each having a gate electrode and a pair of source/drain regions, comprising the steps of:

forming said gate electrodes;

forming said source/drain regions;

forming an insulating layer so as to cover said gate electrodes and said source/drain regions; and forming a conductor line on said insulating layer so as to form a short-circuit through contact holes between said pair of source/drain regions in each of selected FETs, wherein said conductor line is formed of a material selected from the group consisting of polycrystalline silicon, metals, alloys and metal silicides, said conductor line is formed of polycrystalline silicon of one conductivity type, and said conductor line forming said short-circuit between the pair of source/drain regions is formed in each of all the FETs, and then said short-circuit is electrically disconnected by doping impurity of the opposite conductivity type using a resist mask in an intermediate of said conductor line in each of non-selected FETs.

5. The method of manufacturing a mask ROM device as recited in claim 4, wherein said doping is carried out by ion implantation.

* * * * *